(12) United States Patent  (10) Patent No.: US 9,283,869 B2
Yamamoto et al.  (45) Date of Patent: Mar. 15, 2016

(54) POWER SEAT DEVICE

(71) Applicant: Sumitomo Riko Company Limited, Aichi (JP)

(72) Inventors: Masanori Yamamoto, Aichi (JP); Kouichi Hasegawa, Aichi (JP); Tomonori Hayakawa, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 0 days.

(21) Appl. No.: 14/585,553

(22) Filed: Dec. 30, 2014

(65) Prior Publication Data

US 2015/0108818 A1  Apr. 23, 2015

Related U.S. Application Data

(63) Continuation of application No. PCT/JP2013/082115, filed on Nov. 29, 2013.

(30) Foreign Application Priority Data

Nov. 29, 2012 (JP) ................................. 2012-261390

(51) Int. Cl.
*A47C 7/02* (2006.01)
*B60N 2/02* (2006.01)
*H03K 17/96* (2006.01)

(52) U.S. Cl.
CPC ............ *B60N 2/0228* (2013.01); *H03K 17/962* (2013.01); *H03K 2217/960755* (2013.01)

(58) Field of Classification Search
CPC .. B60N 2/0224; B60N 2/0228; B60N 2/0244; H03K 17/962; H03K 2217/960755
See application file for complete search history.

(56) References Cited

U.S. PATENT DOCUMENTS

| 6,509,747 | B2 * | 1/2003 | Nagai | B60N 2/002 180/273 |
| 7,390,982 | B2 * | 6/2008 | Schmidt | B60N 2/0228 200/5 R |
| 7,575,085 | B2 * | 8/2009 | Kamizono | B60R 21/01532 180/273 |
| 7,851,719 | B2 * | 12/2010 | Dzioba | B60N 2/0228 200/512 |
| 8,690,252 | B2 * | 4/2014 | Noguchi | B60N 2/002 297/216.12 |

(Continued)

FOREIGN PATENT DOCUMENTS

JP  2009-022136  1/2009
JP  2009-120141  6/2009

(Continued)

OTHER PUBLICATIONS

Search report from PCT/JP2013/082115, mail date is Jan. 14, 2014.

*Primary Examiner* — Philip Gabler
(74) *Attorney, Agent, or Firm* — Greenblum & Bernstein, P.L.C.

(57) ABSTRACT

Provided is a power seat device in which an operator can intuitively recognize an operation of a movable member. Operation units are provided in movable members in a power seat body. Each of the operation units includes a pair of electrodes and a dielectric layer formed between the pair of electrodes so as to be compressively deformable, and compressively deforms the dielectric layer by an operator's push operation. Driving devices are controlled so that the movable members move in the push direction of the operator based on the capacitance between the pair of electrodes changing with the compressive deformation of the dielectric layer.

10 Claims, 6 Drawing Sheets

(56) References Cited

U.S. PATENT DOCUMENTS

2007/0176473 A1\* 8/2007 Sakai ................. B60N 2/002
 297/216.12
2011/0301809 A1\* 12/2011 Pywell ................ B60N 2/0228
 701/36

FOREIGN PATENT DOCUMENTS

| JP | 2010-221819 | 10/2010 |
| JP | 2010-235081 | 10/2010 |

\* cited by examiner

POWER SEAT DEVICE

CROSS-REFERENCE TO RELATED APPLICATION

This is a continuation of Application PCT/JP2013/082115, filed on Nov. 29, 2013, which is incorporated herein by reference. The present invention is based on Japanese Patent Application No. 2012-261390, filed on Nov. 29, 2012, the entire contents of which are incorporated herein by reference.

BACKGROUND OF THE INVENTION

1. Field of the Invention

The present invention relates to a power seat device.

2. Description of the Related Art

A patent literature 1 (PL1) discloses a power seat device that operates a movable portion of a power seat by an operation of an operation lever.

A patent literature 2 (PL2) discloses a power seat device in which a sensor electrode is disposed in a backrest portion of a power seat and an inclination movement of the backrest portion or a forward and backward movement of a sitting portion is controlled by a change in capacitance between the sensor electrode and a hand or the like when an occupant's hand or the like in a rear seat approaches the sensor electrode.

A patent literature 3 (PL3) discloses a power seat device in which a position of a head portion with respect to a headrest in the height direction and the lateral direction is calculated based on a capacitance between an electrode of a capacitance sensor and the head portion by the capacitance sensor provided in the headrest and the headrest is moved so as to be positioned to the head portion.

A patent literature 4 (PL4) discloses a power seat device which is operated at a low speed until an operation time for an operation switch elapses by a predetermined time and is operated at a high speed after the time elapses during the adjustment of the seat.

PL1: JP2009-22136A
PL2: JP2010-235081A
PL3: JP2010-221819A
PL4: JP2009-120141A

SUMMARY OF THE INVENTION

As in PL1 in which the power seat is operated by the operation lever provided at one position, an operator can not easily recognize a desirable direction of a certain lever. As in PL2 and PL3 in which a movable member of the seat is moved by an approach of a part of a human body using the capacitance sensor, there is a concern that the same operation may be performed even when a part of the operator's body approaches the sensor by chance. In these power seats, it is difficult to mention that the operability of the operator is satisfactory.

The present invention is made in view of such circumstances, and an object thereof is to provide a power seat device in which an operator can intuitively recognize an operation of a movable member.

A power seat device according to the present means includes: a power seat body that is able to adjust the state thereof; a driving device that adjusts the state of the power seat body; an operation unit that is provided in a movable member in the power seat body, includes a pair of electrodes and a dielectric layer formed between the pair of electrodes so as to be compressively deformable, and compressively deforms the dielectric layer by an operator's push operation; a detector that detects a capacitance between the pair of electrodes with the compressive deformation of the dielectric layer; and a control device that controls the driving device so that the movable member is moved in the push direction of the operator based on the capacitance.

The operation unit is configured as a capacitance type sensor, and the dielectric layer is compressively deformed by the operator's push operation. When the dielectric layer is compressively deformed, the capacitance between the pair of electrodes changes. That is, it is possible to recognize whether the push operation is performed by the operator by detecting the capacitance between the pair of electrodes. Then, when the push operation is performed by the operator, the movable member is moved.

Here, the movable member moves in the push direction of the operator. In other words, the movement direction of the movable member includes an element in the push direction of the operator. Accordingly, when the operator applies a push force to the movable member that needs to be moved in a desired movement direction, the movable member moves in a desired direction. In this way, the movement of the movable member can be intuitively recognized by the operator. Accordingly, the operability is drastically improved.

EMBODIMENTS

Hereinafter, a preferred embodiment of a connector according to the present means will be described.

Further, the power seat body may include a plurality of movable members, and the power seat device may include a plurality of driving devices and a plurality of operation units so as to correspond to the plurality of movable members. In a case where the plurality of operation units are provided, the movable member corresponding to each operation unit can be moved. Then, even when the plurality of operation units are disposed at a close position, an erroneous operation can be prevented since the operator operates the driving device by pushing the operation unit.

Further, the operation unit may be disposed inside the power seat body, and may be configured as a capacitance type sensor formed of elastomer. When the operation unit is disposed in the power seat body, the satisfactory operability can be exhibited as described above while the comfortable sitting feeling is ensured.

Further, the operation unit may be fixed to the rear surface of the surface layer of the power seat body. Accordingly, even when the power seat body is deformed by the movement of the occupant, the positional deviation of the operation unit can be prevented. Accordingly, the operability can be satisfactorily improved. Further, when the operation unit is fixed to the rear surface of the surface layer, the dielectric layer can be easily compressively deformed by the operator's push operation. That is, the sensitivity of the operation unit can be satisfactorily improved.

Further, the control device may control the driving device so that the moving speed of the movable member increases with an increase in the capacitance detected by the detector. Here, a relation is established in which the capacitance increases with an increase in the push amount of the operator. That is, when the operator strongly pushes the operation unit, the moving speed of the movable member increases. This operation becomes an operation which is intuitively recognized by the operator. Accordingly, the operability is improved.

Further, the control device may compare the capacitance detected by the detector with each of the plurality of threshold values, and may control the driving device so that the moving speed of the movable member gradually increases with an increase in capacitance.

Here, even when the operator tries to apply a constant push force, the compressive deformation amount of the dielectric layer changes due to the movement of the movable member of the power seat body. Therefore, when the gradual threshold values are set and the moving speed of the movable member is gradually changed, a change in the compressive deformation amount of the dielectric layer with the movement of the movable member of the power seat body is not easily influenced. That is, the operator may not easily feel uncomfortable when the moving speed of the movable member of the power seat body changes.

Further, the power seat device may include a permission switch that permits the movement of the movable member by the operation of the operator, and the control device may control the driving device when the permission switch becomes the permission state by the operation of the operator. Accordingly, a change in capacitance can be detected based on the operator's intention, and in that case, the movable member can be moved.

In this case, the control device may set the capacitance detected by the detector when the permission switch becomes the permission state by the operation of the operator as a reference value, and may control the driving device so that the movable member moves based on a difference between the capacitance detected by the detector and the reference value.

A case where the permission switch becomes the permission state corresponds to the setting of the zero point of the capacitance. That is, the zero point of the capacitance is set by the operator's intention. Then, the movable member is moved based on the capacitance increase amount from the capacitance adjusted to the zero point. Accordingly, the capacitance increase amount can be detected in a case where the operator's intention exists, and the movable member can be moved based on the capacitance.

Further, the control device may control the driving device after the capacitance change amount per unit time detected by the detector is included in the set range.

There is a case in which the capacitance may change due to the deformation of the seat body when a human sits on the seat. However, the capacitance change amount per unit time (hereinafter, referred to as a change speed) at this time is larger than the capacitance change speed generated by the push operation. Further, the capacitance has a light fluctuation even when no external factor exists. The capacitance change speed at this time is smaller than the capacitance change speed due to the push operation. Therefore, a change in capacitance due to the push operation can be recognized by controlling the driving device after the capacitance change speed is included in the set range. That is, the movable member can be moved by the operator's intention.

In this case, the control device may set the capacitance detected by the detector when the capacitance change amount per unit time is included in the set range as a reference value, and may control the driving device so that the movable member moves based on a difference between the capacitance detected by the detector and the reference value.

A case where the capacitance change speed is included in the set range corresponds to the setting of the zero point of the capacitance. That is, the zero point of the capacitance is set by the operator's intention. Then, the movable member is moved based on the capacitance increase amount from the capacitance adjusted to the zero point. Accordingly, the capacitance increase amount in a case where the operator's intention exists can be detected, and the movable member can be moved based on the capacitance.

DESCRIPTION OF THE PREFERRED EMBODIMENTS

First Embodiment

Description of Power Seat Body and Operation Unit

Figure 1:
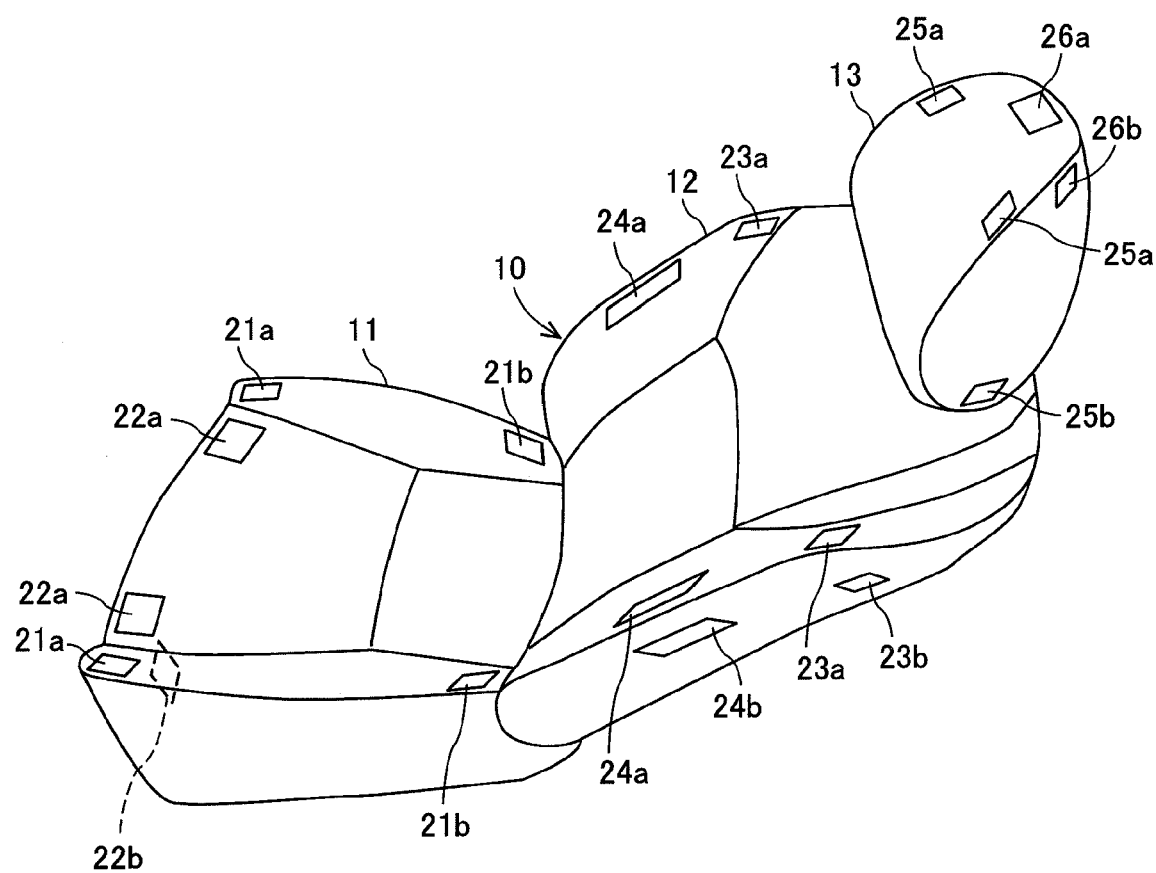
FIG. 1 is a perspective view illustrating a power seat body and an operation unit of an embodiment of the present invention.

A power seat device of a first embodiment will be described with reference to the drawings. As illustrated in FIG. 1, the power seat device includes a power seat body 10 that can adjust a state (a posture). The power seat body 10 is applied to a vehicle seat, and includes a seating surface 11, a back surface 12, and a headrest 13. Further, the power seat body 10 can perform a longitudinal slide operation of the seating surface 11, a tilt operation of the seating surface 11, a reclining operation of the back surface 12, a forward and backward movement operations of a lumbar support (not illustrated) provided in the back surface 12, an upward and downward movement operations of the headrest 13, and an inclination operation of the headrest 13 through an electrical operation.

The power seat body 10 is provided with operation units 21a, 21b, 22a, 22b, 23a, 23b, 24a, 24b, 25a, 25b, 26a, and 26b for performing the operations of the movable members 11, 12, and 13. The operation units 21a and the others are pushed by an occupant (an operator). Then, when the operation units 21a and the others are pushed, the corresponding movable members 11 and the others are moved.

Further, the movement direction of each of the movable members 11 and the others include an element of the push direction of the operator with respect to the operation units 21a and the others. That is, when the operator applies a push force to the movable members 11 and the others as movement targets in a desired movement direction, the movable members 11 and the others move in a desired direction. In this way, the movement of the movable members 11 and the others can be intuitively recognized by the operator, and hence the operability is drastically improved.

In addition, a plurality of the operation units 21a and the others are disposed, but the movable members 11 and the others respectively corresponding to the operation units 21a and the others can be reliably moved. This is because the movable members 11 and the others move when the operation units 21a and the others are pushed by the operator. That is, even when the operation units 21a and the others are disposed at a close position and one operation unit is pushed, the movable members 11 and the others corresponding to the other operation units do not move unless the other operation units are pushed. Accordingly, an erroneous operation can be reliably prevented.

Hereinafter, the arrangement and the functions of the operation units 21a and the others will be described.

The operation unit 21a is used to perform the backward slide operation of the seating surface 11, and is disposed at two positions which are right and left side in the front area of the upper surface of the seating surface 11. The operation unit 21a can receive a backward push operation from the operator. The operation unit 21b is used to perform the forward slide operation of the seating surface 11, and is disposed at two positions which are right and left side in the rear area of the upper surface of the seating surface 11. The operation unit 21b can receive a forward push operation from the operator.

The operation unit 22a is used to perform the forward lowering tilt operation of the seating surface 11, and is disposed at two positions which are right and left side in the front area of the upper surface of the seating surface 11. The operation unit 22a can receive a downward push operation from the operator. The operation unit 22b is used to perform the forward raising tilt operation of the seating surface 11, and is disposed at two positions which are right and left side in the front surface of the seating surface 11. The operation unit 22b can receive the upward push operation from the operator.

The operation unit 23a is used to perform the reclining operation of the back surface 12, and is disposed at two positions which are right and left side at the front surface of the upper area of the back surface 12. The operation unit 23a can receive the backward push operation from the operator. The operation unit 23b is used to perform the reclining return operation of the back surface 12, and is disposed at two positions which are right and left side of the rear surface of the upper area of the back surface 12. The operation unit 23b can receive the forward push operation from the operator.

The operation unit 24a is used to perform the backward movement operation of the lumbar support of the back surface 12, and is disposed at two positions which are right and left side of the front surface of the lower area of the back surface 12. The operation unit 24a can receive the backward push operation from the operator. The operation unit 24b is used to perform the forward movement operation of the lumbar support of the back surface 12, and is disposed at two positions which are right and left side of the rear surface of the lower area of the back surface 12. The operation unit 24b can receive the forward push operation from the operator.

The operation unit 25a is used to perform the downward movement operation of the headrest 13, and is disposed at two positions which are right and left side of the upper end of the headrest 13. The operation unit 25a can receive the downward push operation from the operator. The operation unit 25b is used to perform the upward movement operation of the headrest 13, and is disposed at two positions which are right and left side of the lower end of the headrest 13. The operation unit 25b can receive the upward push operation from the operator.

The operation unit 26a is used to perform the backward inclination operation of the headrest 13, and is disposed at one position of the front surface of the upper end of the headrest 13. The operation unit 26a can receive the backward push operation from the operator. The operation unit 26b is used to perform the forward inclination operation of the headrest 13, and is disposed at two positions which are right and left side of the rear surface of the headrest 13. The operation unit 26b can receive the forward push operation from the operator.

(Configuration of Operation Unit)

Next, a configuration of each of the operation units 21a and the others will be described with reference to FIGS. 2A and 2B. Each of the operation units 21a and the others are configured as a capacitance type sensor. Further, the operation units 21a and the others are formed of elastomer, are flexible, and are stretchable in the surface tangential direction.

Figure 2A:
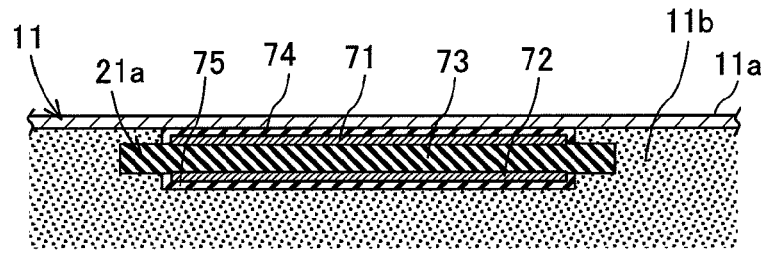
FIG. 2A is a cross-sectional view of the operation unit of FIG. 1 and is a view illustrating a state where a push operation is not performed by an operator.

As illustrated in FIG. 2A, specifically, each of the operation units 21a and the others include a first electrode 71 and a second electrode 72 that are separated from each other in the surface normal direction (the up and down directions of FIG. 2A) while facing each other, a dielectric layer 73 that is formed between the electrodes 71 and 72 so as to be elastically deformable, and insulation layers 74 and 75 that are formed so as to coat the front surface near the first electrode 71 and the rear surface near the second electrode 72.

Here, the first and second electrodes 71 and 72 are formed of elastomer mixed with conductive filler. Further, the dielectric layer 73 and the insulation layers 74 and 75 are formed of elastomer.

Then, the operation unit 21a is disposed inside a corresponding portion of each of the movable members 11, 12, and 13 of the power seat body 10. Specifically, the operation unit 21a is disposed between the rear surface of the epidermis material 11a of the seating surface 11 and the cushion material 11b, and is fixed while being, for example, sewn to the rear surface of the epidermis material 11a. The other operation units 21b and the others are also fixed to the rear surfaces of the epidermis materials 11a and the others of the corresponding movable members 11 and the others in the same way.

Here, the spring constant of the dielectric layer 73 in the compressing and stretching direction is smaller than the spring constants of the epidermis materials 11a and the others and the cushion material 11b in the respective directions. That is, the operation unit 21a may be easily deformed compared to the epidermis material 11a and the cushion material 11b. Further, the spring constant of the dielectric layer 73 is equal to or smaller than the spring constants of the first and second electrodes 71 and 72 and the insulation layers 74 and 75.

Figure 2B:
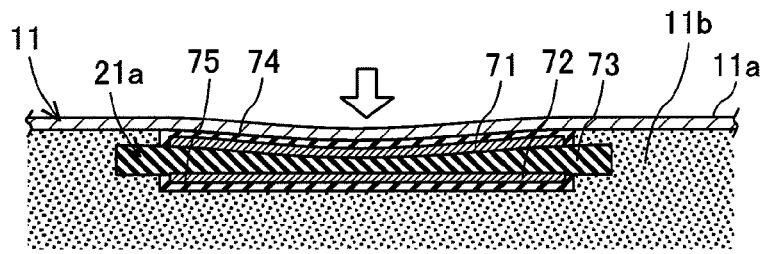
FIG. 2B is a cross-sectional view of the operation unit of FIG. 1 and is a view illustrating a state where the push operation is performed by the operator.

For this reason, a case where the operator pushes the operation units 21a and the others are illustrated in FIG. 2B. That is, when the epidermis material 11a is deformed as a recess by the push operation, the dielectric layer 73 is compressively deformed with the deformation of the epidermis material 11a. That is, the thickness of the dielectric layer 73 is thinned. At this time, the first electrode 71 is deformed so as to follow the deformation of the epidermis material 11a, and the second electrode 72 is not substantially deformed.

Here, the capacitance between the first and second electrodes 71 and 72 is inversely proportional to the separation distance between the first and second electrodes 71 and 72. That is, when the dielectric layer 73 is compressively deformed by the push operation, the capacitance between the first and second electrodes 71 and 72 changes so as to increase. That is, it is possible to recognize whether the push operation is performed by the operator by detecting the capacitance.

Particularly, when the operation units 21a and the others are fixed to the rear surfaces of the epidermis materials 11a and the others, the dielectric layer 73 can be easily compressively deformed by the operator's push operation. That is, the sensitivity of the operation units 21a and the others can be satisfactorily improved.

Incidentally, the epidermis materials 11a and the others of the movable members 11 and the others are deformed by the movement of the occupant on the power seat body 10. Even in such a case, the operation units 21a and the others are deformed so as to follow the deformation of the epidermis materials 11a and the others of the movable members 11 and the others. Accordingly, even when the shape of the epidermis material 11a changes, the positional deviation of the operation units 21a and the others with respect to the epidermis material 11a can be prevented. Accordingly, the operation units 21a and the others can be reliably pushed during the operation of the operator. That is, the operability can be satisfactorily improved. Further, even when the operation units 21a and the others are disposed inside the movable members 11 and the others, the comfortable sitting feeling can be satisfactorily ensured since the operation units 21a and the others are formed of elastomer.

(Configuration of Power Seat Device)

Figure 3:
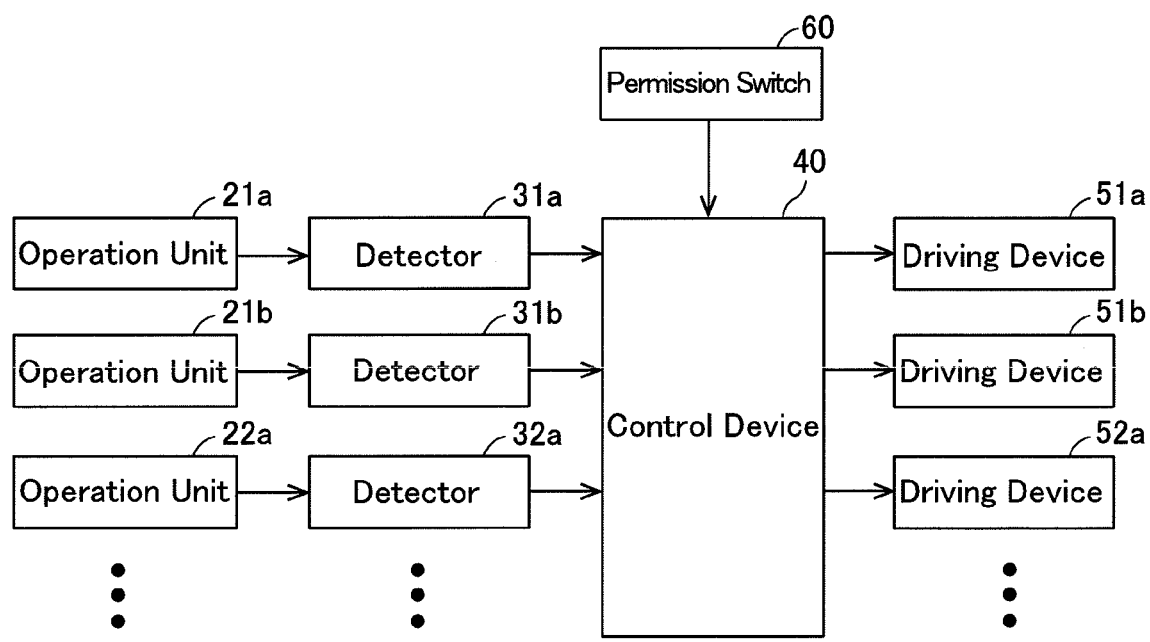
FIG. 3 is a block diagram illustrating a configuration of the power seat device of the embodiment.

Next, a configuration of the power seat device will be described with reference to FIG. 3. As illustrated in FIG. 3, the power seat device includes the power seat body 10, the operation units 21a and the others, a detectors 31a and the others, a control device 40, a driving devices 51a and the others, and a permission switch 60.

As illustrated in FIG. 1, the operation units 21a and the others are disposed in the movable members 11 and the others of the power seat body 10. As illustrated in FIG. 2, the operation unit 21a includes a pair of electrodes 71 and 72 and a dielectric layer 73 that is formed between the pair of electrodes 71 and 72 so as to be compressively deformable, and is formed so as to compressively deform the dielectric layer 73 by the operator's push operation.

The detectors 31a and the others are electrically connected to the pair of electrodes 71 and 72 of the corresponding operation unit 21a, and detect the capacitance between the pair of electrodes 71 and 72 of the corresponding operation units 21a and the others. That is, the detectors 31a and the others detect the capacitance between the pair of electrodes 71 and 72 changing with the compressive deformation of the dielectric layer 73 of the operation units 21a and the others.

The permission switch 60 switches a permission state and a non-permission state by the operator. The operator adjusts the permission switch 60 to the permission state when the state of the power seat body 10 needs to be adjusted and adjusts the permission switch 60 to the non-permission state when the state of the power seat body 10 does not need to be adjusted.

The driving devices 51a and the others are configured as, for example, motors, and are provided in the movable members 11 and the others. The driving devices 51a and the others are correlated to the operation unit 21a.

The control device 40 controls the corresponding driving devices 51a and the others based on the capacitance detected by the detectors 31a and the others when the permission switch 60 is adjusted to the permission state. That is, the control device 40 controls the driving devices 51a and the others so that the corresponding movable members 11 and the others move in the push direction of the operator based on the capacitance between the pair of electrodes 71 and 72 of the operation units 21a and the others.

(Description for Movement Direction of Movable Member and Push Direction)

As described above, the movable members 11 and the others move in the push direction of the operator. This will be described in detail by referring to FIGS. 4A and 4B. Here, the reclining operation of the back surface 12 will be described.

Figure 4A:
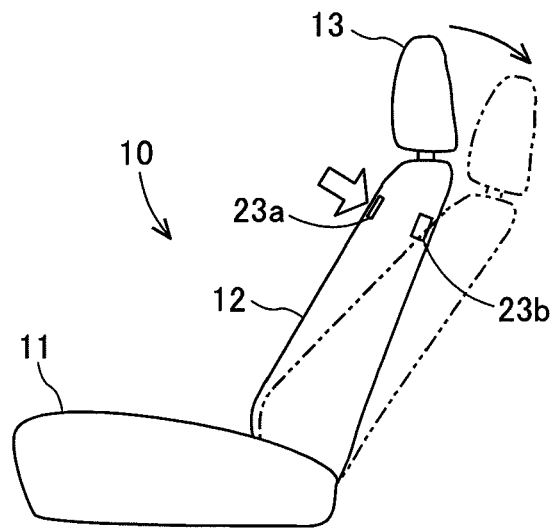
FIG. 4A is a view illustrating an operation of the power seat body illustrated in FIG. 1 when an operation unit corresponding to a reclining operation is pushed.

As illustrated in FIG. 4A, in order to perform the reclining operation of the back surface 12, the operation unit 23a disposed at the front surface of the upper area of the back surface 12 is pushed. Here, the push operation for the operation unit 23a is performed in the backward and downward directions. The reclining operation of the back surface 12 is performed by the push operation. The operation direction of the back surface 12 is the backward rotation direction about the connection shaft with respect to the seating surface 11. Here, the operation direction becomes the backward and downward directions when viewed from the position of the operation unit 23a. In this way, the movement direction of the operation unit 23a in the back surface 12 includes an element of the push direction with respect to the operation unit 23a.

Figure 4B:
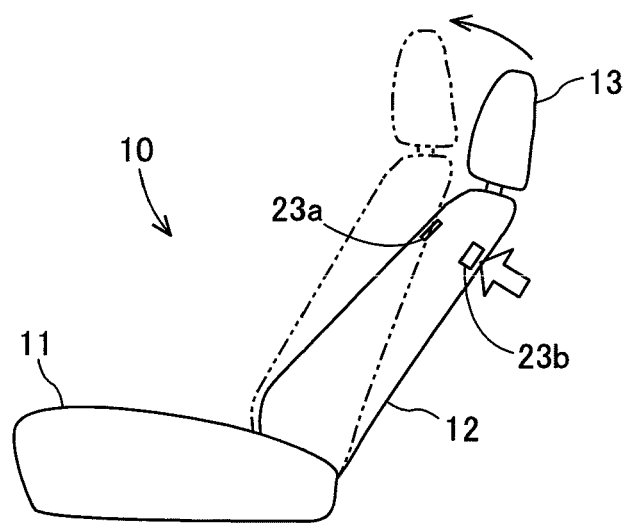
FIG. 4B is a view illustrating an operation of the power seat body illustrated in FIG. 1 when an operation unit corresponding to a reclining return operation is pushed.

In contrast, as illustrated in FIG. 4B, in order to perform the reclining return operation of the back surface 12, the operation unit 23b disposed in the rear surface of the upper area of the back surface 12 is pushed. Here, the push operation for the operation unit 23b is performed in the forward and upward directions. The reclining return operation of the back surface 12 is performed by the push operation. The operation direction of the back surface 12 is the forward rotation direction about the connection shaft with respect to the seating surface 11. Here, the operation direction becomes the forward and upward directions when viewed from the position of the operation unit 23b. In this way, the movement direction of the operation unit 23b in the back surface 12 includes an element in the push direction with respect to the operation unit 23b.

In this way, when the operator applies a push force to the back surface 12 that needs to be moved in a desired movement direction, the back surface 12 moves in a desired direction. In this way, the reclining operation of the back surface 12 can be intuitively recognized by the operator. The same applies to the operations of the other movable members 11 and the others. Accordingly, the operability is drastically improved.

(Description for Control of Driving Device by Control Device)

As illustrated in FIG. 3, the control device 40 controls the driving devices 51a and the others based on the capacitance detected by the detectors 31a and the others. Here, the control device 40 controls the driving device 51a so that the moving speed of each of the movable members 11 and the others increases with an increase in the detected capacitance change amount (an increase amount with respect to the reference value). This will be described with reference to FIG. 5.

Figure 5:
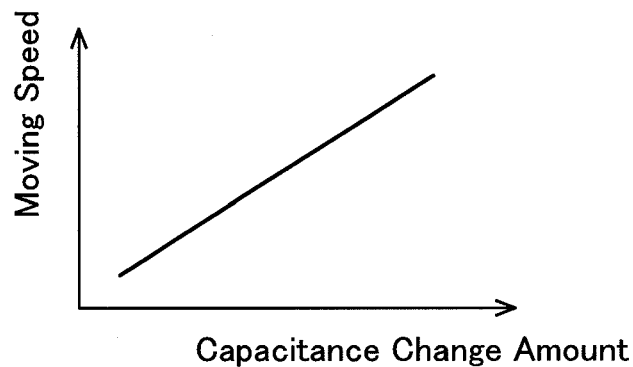
FIG. 5 is a diagram illustrating a relation between a capacitance detected by a detector of FIG. 3 and a speed at which a movable member is moved by a driving device.

According to FIG. 5, a relation is established in which the moving speed of each of the movable members 11 and the others linearly increases with an increase in the detected capacitance change amount. Then, a relation is established in which the capacitance increases with an increase in the push amount of each of the operation units 21a and the others by the operator. That is, when the operator strongly pushes the operation units 21a and the others, the moving speed of each of the movable members 11 and the others increases. This operation becomes an operation that is intuitively recognized by the operator. Accordingly, the operability is improved.

Here, as described by referring to FIG. 5, the control device 40 defines the moving speed of each of the movable members 11 and the others by using the capacitance change amount, that is, a capacitance increase amount with respect to the reference value. The detected capacitance changes due to the deformation of the operation units 21a and the others when a human sits on the seat or the change over time. For this reason, in order to extract only the push operation by the operator, the capacitance increase amount from the reference value is used as an index. Then, in this embodiment, the reference value of the capacitance is set as the capacitance when the permission switch 60 is adjusted to the permission state.

In this case, the capacitance detected by the detectors 31a and the others and the moving speed of each of the movable members 11 and will be described with reference to FIG. 6. The upper drawing of FIG. 6 indicates a behavior of the capacitance detected by the detector 31a with time. The capacitance has a slight fluctuation from the start of the detection, and is substantially constant. Subsequently, when a human sits on the power seat body 10, the capacitance largely changes. Subsequently, the capacitance has a light fluctuation again.

Then, the permission switch 60 is set as the permission state (indicated by SW (ON)) by the operator. Subsequently, the operation units 21a and the others are pushed by the operator. The push force gradually increases. As a result, the capacitance gradually increases. Then, when the operator's push operation ends, the capacitance substantially returns to the value before the change occurs.

Figure 6:
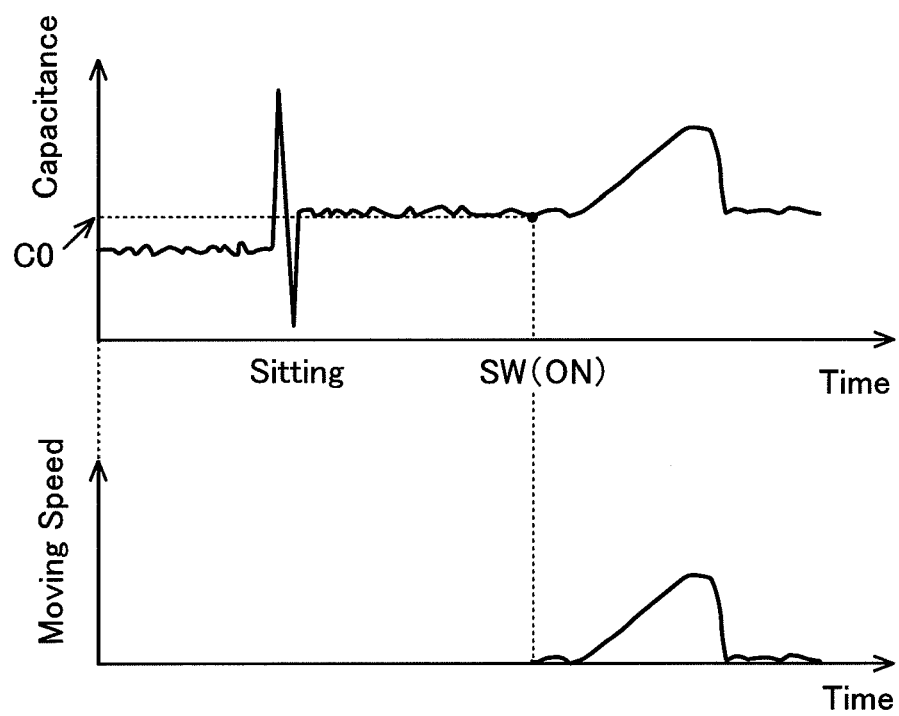
FIG. 6 is a diagram illustrating a behavior of the capacitance detected by the detector of FIG. 3 and a behavior of the moving speed of the movable member driven by the driving device.

In this case, the moving speed of each of the movable members 11 and the others is illustrated in the lower drawing of FIG. 6. First, the moving speed becomes zero until the permission switch 60 becomes the permission state. That is, the movable members 11 and the others do not move. After the permission switch 60 becomes the permission state, the moving speed also increases with an increase in capacitance change amount. Here, the capacitance when the permission switch 60 becomes the permission state is set as the reference value C0. That is, the moving speed of each of the movable members 11 and the others increases in response to an increase amount from the reference value C0.

As described above, the control device 40 controls the driving devices 51a and the others when the permission switch 60 becomes the permission state. Accordingly, a change in capacitance can be detected based on the operator's intention, and in that case, the movable members 11 and the others can be moved.

When the permission switch 60 becomes the permission state, the reference value of the capacitance C0 is set. In other words, a zero point is set at this moment. That is, the zero point of the capacitance is set by the operator's intention. Then, the movable members 11 and the others are moved based on the capacitance increase amount of the capacitance adjusted to the zero point. Accordingly, the capacitance increase amount in the case where the operator's intention exists can be detected, and the movable members 11 and the others can be moved based on the capacitance.

Second Embodiment

Figure 7:
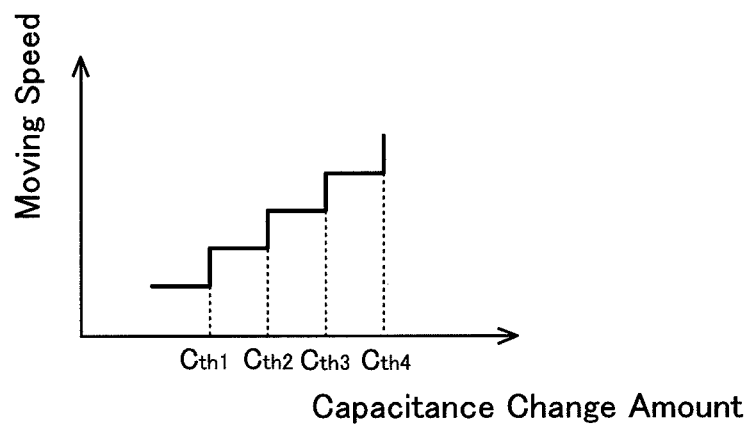
FIG. 7 is a diagram illustrating a relation between a capacitance detected by a detector of FIG. 3 and a speed at which a movable member is moved by a driving device in a second embodiment.

In the above-described embodiment, as illustrated in FIG. 5, a relation is established in which the moving speed of each of the movable members 11 and the others linearly increases with respect to an increase in the detected capacitance change amount. In this embodiment, as illustrated in FIG. 7, a relation is established in which the moving speed of each of the movable members 11 and the others like gradually increases with an increase in the detected capacitance change amount.

The control device 40 compares the detected capacitance with each of a plurality of threshold values $C_{th1}$, $C_{th2}$, $C_{th3}$, and $C_{th4}$, and controls the driving devices 51a and the others so that the moving speed of each of the movable members 11 and the others gradually increases with an increase in capacitance change amount.

In this case, the capacitance detected by the detectors 31a and the others and the moving speed of each of the movable members 11 and the others will be described with reference to FIG. 8. Since the upper drawing of FIG. 8 is the same as the upper drawing of FIG. 6 of the above-described embodiment, the description thereof will be omitted.

Figure 8:
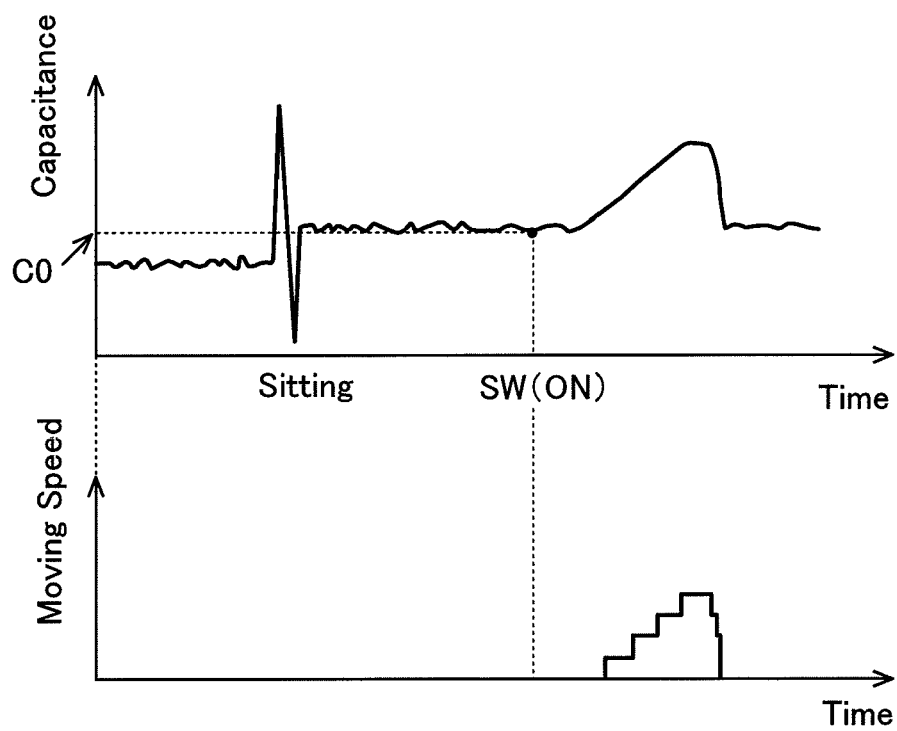
FIG. 8 is a diagram illustrating a behavior of the capacitance detected by the detector of FIG. 3 and a behavior of the moving speed of the movable member driven by the driving device in the application of the relation of FIG. 7.

The moving speed of each of the movable members 11 and the others is illustrated in the lower drawing of FIG. 8. First, the moving speed is zero until the permission switch 60 becomes the permission state. That is, the movable members 11 and the others do not move. After the permission switch 60 becomes the permission state, the moving speed also increases with an increase in capacitance change amount. Here, the capacitance when the permission switch 60 becomes the permission state is set as the reference value C0. That is, the moving speed of each of the movable members 11 and the others increases in response to an increase amount from the reference value C0.

Here, as illustrated in FIG. 7, when the detected capacitance change amount exceeds each of the gradual threshold values $C_{th1}$, $C_{th2}$, $C_{th3}$, and $C_{th4}$, the moving speed of each of the movable members 11 and the others increases. Accordingly, as illustrated in FIG. 8, when the operator's push amount increases, the moving speed of each of the movable members 11 and the others gradually increases (in a step shape).

Here, even when the operator tries to apply a constant push force to the operation units 21a and the others, the compressive deformation amount of the dielectric layer 73 changes due to the movement of the movable members 11 and the others of the power seat body 10. Therefore, as illustrated in FIG. 7, when the gradual threshold values $C_{th1}$, $C_{th2}$, $C_{th3}$, and $C_{th4}$ are set and the moving speed of each of the movable members 11 and the others is gradually changed, a change in the compressive deformation amount of the dielectric layer 73 with the movement of the movable members 11 and the others of the power seat body 10 is not easily influenced. That is, the operator may not easily feel uncomfortable when the moving speed of each of the movable members 11 and the others of the power seat body 10 changes.

Third Embodiment

In the above-described embodiment, the capacitance when the permission switch 60 becomes the permission state is set as the reference value. Alternatively, the reference value may be set as the capacitance when the capacitance change speed (the derivative value) is included in the set range. Hereinafter, this will be described by referring to FIG. 9.

Figure 9:
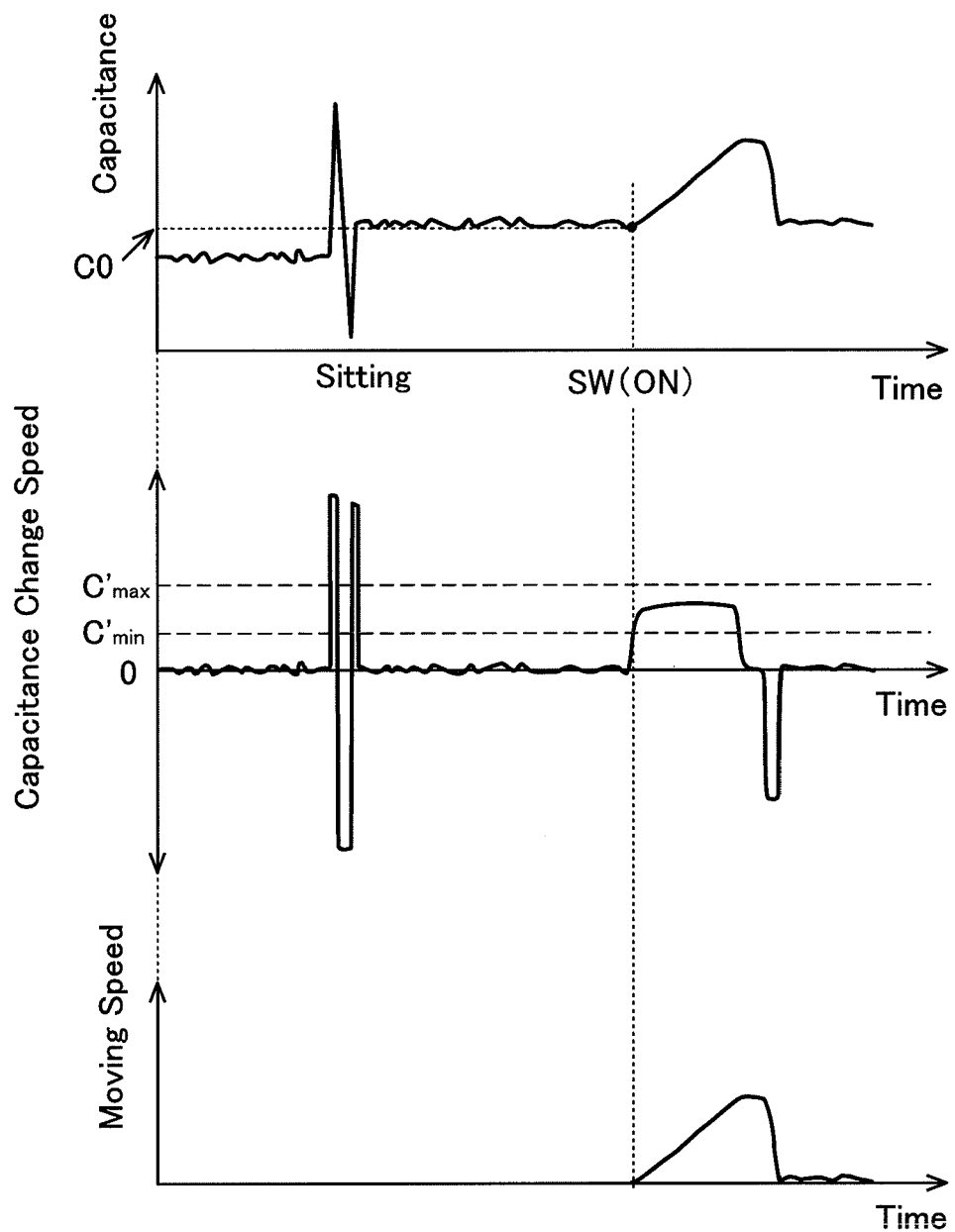
FIG. 9 is a diagram illustrating a behavior of a capacitance detected by a detector, a behavior of a capacitance change speed (a derivative value), and a behavior of a moving speed of a movable member driven by a driving device in a third embodiment.

The upper drawing of FIG. 9 indicates a behavior of the capacitance detected by the detector 31a with time as in the case of FIG. 6. The middle drawing of FIG. 9 indicates a behavior of the capacitance change amount per unit time (hereinafter, referred to as a capacitance change speed) with time.

The capacitance change speed (the derivative value) is higher than the upper-limit threshold value $C_{max}$ or is lower than the lower-limit threshold value $C_{min}$ when a human sits on the seat. Further, the capacitance change speed substantially becomes zero until the permission switch 60 becomes the permission state before and after the human sits on the seat, which is lower than the lower-limit threshold value $C_{min}$.

Then, when the operation units 21*a* and the others are pushed after the permission switch 60 becomes the permission state, the capacitance change speed (the derivative value) is included in the range between the lower-limit threshold value $C_{min}$ and the upper-limit threshold value $C_{max}$. The capacitance at this moment is set as the reference value C0.

Then, the moving speed of each of the movable members 11 and the others is illustrated in the lower drawing of FIG. 9. First, the moving speed becomes zero until the permission switch 60 becomes the permission state. In addition, even after the permission switch 60 becomes the permission state, the moving speed becomes zero until the capacitance change speed (the derivative value) is included in the range between the lower-limit threshold value $C_{min}$ and the upper-limit threshold value $C_{max}$. Subsequently, the moving speed also increases in response to the capacitance increase amount with respect to the reference value C0.

Here, there is a case in which the capacitance changes by the deformation of the power seat body 10 when a human sits on the seat. However, the capacitance change speed at this time is larger than the capacitance change speed due to the push operation. Further, the capacitance has a slight fluctuation even when no external factor exists. The capacitance change speed at this time is smaller than the capacitance change speed due to the push operation. Therefore, as described above, a change in capacitance due to the push operation can be recognized by controlling the driving device after the capacitance change speed is included in the set range. That is, the movable members 11 and the others can be moved by the operator's intention.

Further, the reference value of the capacitance is set when the capacitance change speed is included in the set range. In other words, the zero point is set at the moment. That is, the zero point of the capacitance is set by the operator's intention. Then, the movable members 11 and the others are moved based on the capacitance increase amount from the capacitance adjusted to the zero point. Accordingly, the capacitance increase amount in the case where the operator's intention exists can be detected, and hence the movable members 11 and the others can be moved based on the capacitance.

What is claimed is:

1. A power seat device comprising:
    a power seat body that is able to adjust a state thereof;
    a driving device that adjusts the state of the power seat body;
    an operation unit that is provided in a movable member in the power seat body, the operation unit including a pair of electrodes and a dielectric layer formed between the pair of electrodes so as to be compressively deformed by an operator's push in a push direction;
    a detector that detects a capacitance between the pair of electrodes with the compressive deformation of the dielectric layer; and
    a control device that controls the driving device so that the movable member is moved in the push direction of the operator based on the capacitance.

2. The power seat device according to claim 1,
    wherein the power seat body includes a plurality of movable members, and
    wherein the power seat device includes a plurality of the driving devices and a plurality of the operation units so as to correspond to the plurality of movable members.

3. The power seat device according to claim 1,
    wherein the operation unit is disposed inside the power seat body, and is a capacitance type sensor formed of elastomer.

4. The power seat device according to claim 3,
    wherein the operation unit is fixed to a rear surface of a surface layer of the power seat body.

5. The power seat device according to claim 1,
    wherein the control device controls the driving device so that a moving speed of the movable member increases with an increase in the capacitance detected by the detector.

6. The power seat device according to claim 5,
    wherein the control device compares the capacitance detected by the detector with each of a plurality of threshold values, and controls the driving device so that the moving speed of the movable member gradually increases with an increase in capacitance.

7. The power seat device according to claim 1,
    wherein the power seat device includes a permission switch that permits the movement of the movable member by the operation of the operator, and
    wherein the control device controls the driving device when the permission switch is adjusted to a permission state by the operation of the operator.

8. The power seat device according to claim 7,
    wherein the control device sets the capacitance detected by the detector when the permission switch becomes the permission state by the operation of the operator as a reference value, and controls the driving device so that the movable member moves based on a difference between the capacitance detected by the detector and the reference value.

9. The power seat device according to claim 1,
    wherein the control device controls the driving device after a capacitance change amount per unit time detected by the detector is included in a set range.

10. The power seat device according to claim 9,
    wherein the control device sets the capacitance detected by the detector when the capacitance change amount per unit time is included in the set range as a reference value, and controls the driving device so that the movable member moves based on a difference between the capacitance detected by the detector and the reference value.

* * * * *